(12) United States Patent
Pas

(10) Patent No.: US 7,795,097 B2
(45) Date of Patent: Sep. 14, 2010

(54) SEMICONDUCTOR DEVICE MANUFACTURED BY REMOVING SIDEWALLS DURING REPLACEMENT GATE INTEGRATION SCHEME

(75) Inventor: Michael F. Pas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 428 days.

(21) Appl. No.: 11/943,106

(22) Filed: Nov. 20, 2007

(65) Prior Publication Data

US 2009/0127632 A1    May 21, 2009

(51) Int. Cl.
*H01L 21/8236* (2006.01)
(52) U.S. Cl. .................. 438/278; 438/199; 438/275; 257/E29.309; 257/E21.423
(58) Field of Classification Search .......... 438/199, 438/275, 278
See application file for complete search history.

(56) References Cited

U.S. PATENT DOCUMENTS

| | | | |
|---|---|---|---|
| 2003/0022422 A1* | 1/2003 | Torii et al. .................. 438/183 |
| 2005/0051854 A1* | 3/2005 | Cabral et al. ................ 257/407 |
| 2006/0046448 A1* | 3/2006 | Barns et al. ................. 438/585 |
| 2007/0037343 A1* | 2/2007 | Colombo et al. ............ 438/231 |
| 2007/0141798 A1* | 6/2007 | Bohr ........................... 438/301 |
| 2007/0178632 A1* | 8/2007 | Jung ........................... 438/182 |
| 2008/0237663 A1* | 10/2008 | Hanafi ......................... 257/289 |

* cited by examiner

*Primary Examiner*—Alexander G Ghyka
(74) *Attorney, Agent, or Firm*—Warren L. Franz; Wade J. Brady, III; Frederick J. Telecky, Jr.

(57) ABSTRACT

One aspect of the invention provides a semiconductor device that includes gate electrodes comprising a metal or metal alloy located over a semiconductor substrate, wherein the gate electrodes are free of spacer sidewalls. The device further includes source/drains having source/drain extensions associated therewith, located in the semiconductor substrate and adjacent each of the gate electrodes. A first pre-metal dielectric layer is located on the sidewalls of the gate electrodes and over the source/drains, and a second pre-metal dielectric layer is located on the first pre-metal dielectric layer. Contact plugs extend through the first and second pre-metal dielectric layers.

18 Claims, 19 Drawing Sheets

SEMICONDUCTOR DEVICE MANUFACTURED BY REMOVING SIDEWALLS DURING REPLACEMENT GATE INTEGRATION SCHEME

TECHNICAL FIELD

The disclosure is directed to a semiconductor device manufactured by removing sidewalls during a replacement gate integration scheme.

BACKGROUND

The ability to dope polysilicon gates to different degrees allows for adjustment of the work function of gate electrode materials to particular types of metal oxide silicon (MOS) transistors. However, it is now understood that polysilicon gates can accommodate only a finite amount of dopants due to the depletion of gate charge carriers at the interface between the gate and gate dielectric, when the gate is biased to invert the channel.

In view of the limitations of doped polysilicon, metal gates have been proposed as an alternative to polysilicon because they have a much larger supply of charge carriers than doped polysilicon gates. One accepted way of manufacturing metal gates is to use a gate last process where the gate is formed after the high thermal budgets have been done to activate the source/drain dopants. In such processes, a polysilicon gate is first formed. A source/drain extension (for example, lightly doped drain (LDD)) is formed, followed by the formation of a spacer, which is used to offset the deep source/drain an appropriate distance from the gate. The polysilicon gate is then removed from between the sidewall spacers and the appropriate metal is then deposited between the sidewall spacers to form the metal gate electrode.

SUMMARY

In one embodiment, a method of manufacturing a semiconductor device is provided. This embodiment comprises forming a sacrificial gate on a semiconductor substrate, forming source/drain extensions adjacent the sacrificial gate, and forming sidewall spacers adjacent the sacrificial gate. The source/drain extensions extend under the sidewall spacers, and deep source/drains are formed adjacent the sacrificial gate and are offset from the sacrificial gate by the width of the sidewall spacers. The sidewall spacers are removed and a nitride layer is formed on the sidewalls and on top of the sacrificial gate subsequent to removing the sidewall spacers. A dielectric layer is formed over the nitride layer, and the nitride layer and the dielectric layer are removed to expose a top surface of the sacrificial gate, wherein portions of the nitride layer remain on sidewalls of the sacrificial gate. The sacrificial gate located between the portions of the nitride layer is removed, and a metal gate is formed between the portions of the nitride layer.

In an additional embodiment, there is provided another method of manufacturing a semiconductor device. In this embodiment, the method comprises forming a sacrificial gate on a semiconductor substrate, forming source/drains adjacent the sacrificial gate. The formation of the source/drains includes forming sidewall spacers on the sacrificial gate, removing the sidewall spacers, and forming a first pre-metal dielectric layer on sidewalls and on top of the sacrificial gate subsequent to removing the sidewall spacers. This method further includes forming a second pre-metal dielectric layer on the first dielectric layer, removing the first and second pre-metal dielectric layers to expose a top surface of the sacrificial gate. Portions of the first dielectric layers remain on sidewalls of the sacrificial gate. The sacrificial gate that is located between the portions of the first pre-metal dielectric layer is removed and a metal gate is formed between the portions of the nitride layer.

In yet another embodiment, a semiconductor device is provided. In this embodiment, the semiconductor device comprises gate electrodes comprising a metal or metal alloy located over a semiconductor substrate, wherein the gate electrodes are free of sidewall spacers. The device further includes source/drains, having source/drain extensions associated therewith, located in the semiconductor substrate and adjacent each of the gate electrodes. A first pre-metal dielectric layer is located on the sidewalls of the gate electrodes and located over the source/drains, and a second pre-metal dielectric layer is located on the first pre-metal dielectric layer. Contact plugs extend through the first and second pre-metal dielectric layers.

BRIEF DESCRIPTION OF DRAWINGS

The disclosure is described with reference to example embodiments and to accompanying drawings, wherein.

DETAILED DESCRIPTION

Figure 1:
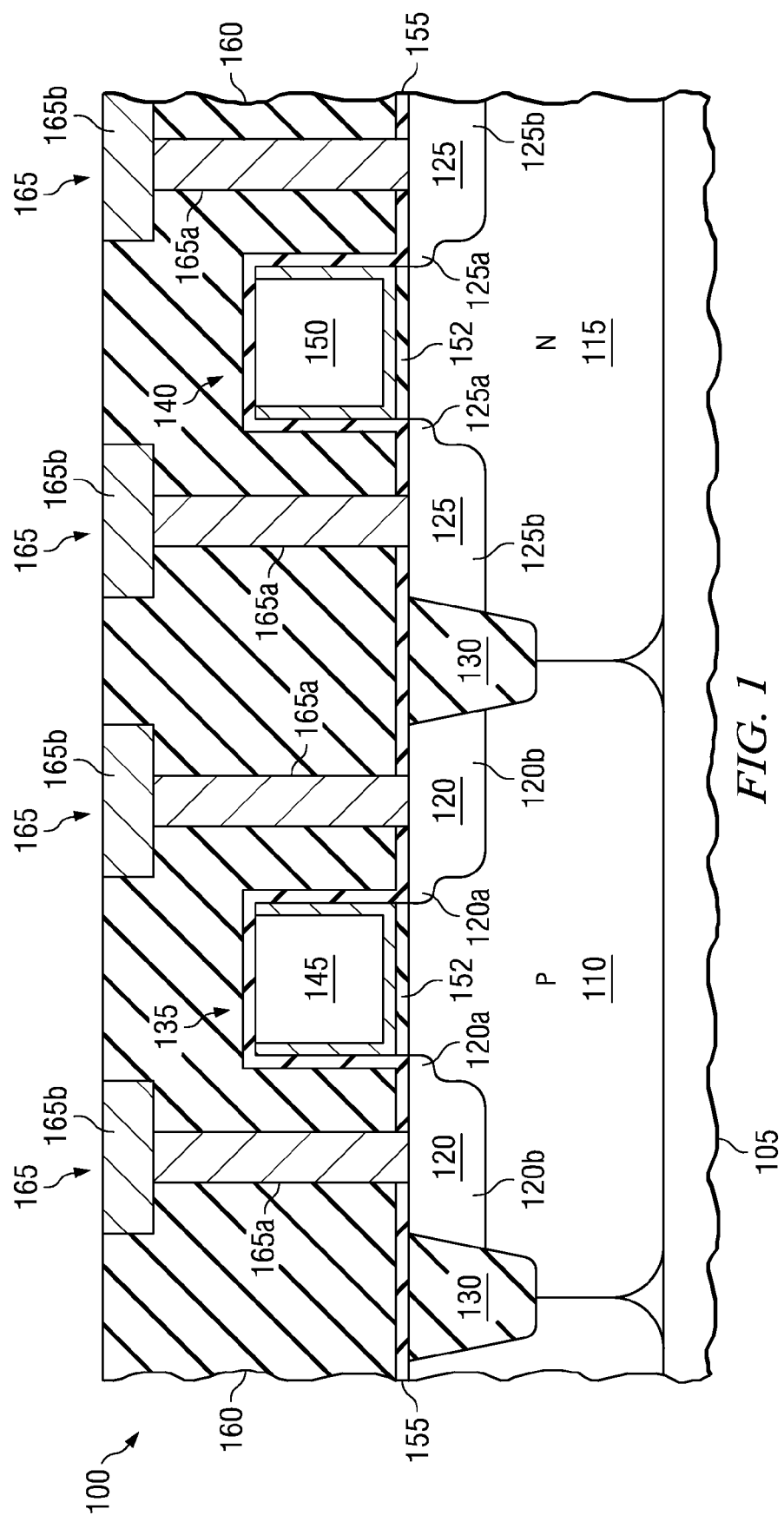
FIG. 1 illustrates a semiconductor device that can be made using the principles of the invention.

FIG. 1 illustrates one embodiment of a semiconductor device 100 that can be made in accordance with the invention. In this embodiment, the device 100 includes a semiconductor substrate 105. The substrate 105 may be any semiconductor layer located on a semiconductor wafer, such as an epitaxial layer, or it may be a doped region of the wafer. The substrate 105 may comprise conventional materials, such as doped silicon, gallium arsenide, silicon-on-insulator, silicon germanium, etc. Wells 110, 115 are formed in the substrate 105 and may be conventionally formed, and they may be doped the same or in a complementary fashion as indicated in the embodiment of FIG. 1.

The device 100 also includes source/drains 120, 125 located in each of the wells 110, 115. Isolation structures 130 electrically isolate source/drains 120, 125 from each other. The source/drains include shallow extension regions 120a, 125a and deep source/drains regions 120b, 125b. As used herein, extension regions are doped regions that make up a part of the source/drains 120, 125. The extension regions 120a, 125a, however, are distinguished from the deep source/drains 120b, 125b in that they have a lighter dopant concentration and the dopants are not driven as deeply as the deep source/drains 120b, 125b. Further, the extensions are that portion of the source/drains 120, 125 that extend up to or slightly under the adjacent gates. Conventional dopant schemes and processes may be used to form both the extensions 120a, 125a and deep source/drains 120b, 125b. The concentration and depth of each of the extension regions 120a, 125a and deep source/drains 120b, 125b will depend on its specific design. As explained below, sidewall spacers are used to offset the deep source/drains 120b, 125b from gate structures 135, 140.

The gate structures 135, 140 include metal gate electrodes 145, 150, which in one embodiment, may comprise a stack of metal layers, as shown, or alloys of metals. Also, in some embodiments, a portion of the gates 145, 150 may comprise a doped polysilicon. The gate electrodes 145, 150 may be isolated from the substrate 105 by a conventional gate dielectric layer 152. The metals used will depend on the type of device. For example, as shown in the embodiment of FIG. 1, the gate structure 135 may be configured as an NMOS, while the gate structure 140 may be configured as a PMOS. As such, different types of metals could be used to achieve the desired work function for each of the devices.

Located on the sides of and over the gate structures 135, 140 is a pre-metal dielectric layer 155. As used herein, a pre-metal dielectric layer is one that is formed prior to the first metallization level. As discussed concerning certain embodiments, layer 155 may be removed and replaced by one or more pre-metal dielectric layer or layers. For purposes herein, the dielectric layer 155 is not a sidewall spacer, since it is not used to offset the deep source/drains 120b, 125b from the gate electrodes 145, 150. The offset of the deep/source drains 120b, 125b from the gate electrodes 145, 150 is achieved by using convention, sacrificial sidewall spacers that are subsequently removed after source/drain formation. Thus, sidewall spacers are not located adjacent the gate electrodes 145, 150 as found in conventional devices having source/drain extensions. As such, the gate electrodes 145, 150 are free of sidewall spacers.

A second pre-metal dielectric layer 160 may also be present. Portions of interconnect structures 165, such as contact plugs 165a, extend through the first and second pre-metal dielectric layers 155, 160 to make contact with the source/drains 120, 125, as shown. The interconnect structures 165 may also include metal runners or lines 165b. The interconnect structures 165 may be conventional structures, such as damascene or dual damascene structures. Having set forth one of many embodiments of device 100 as covered by the invention, various methods for fabricating the device 100 will now be discussed.

Figure 2A:
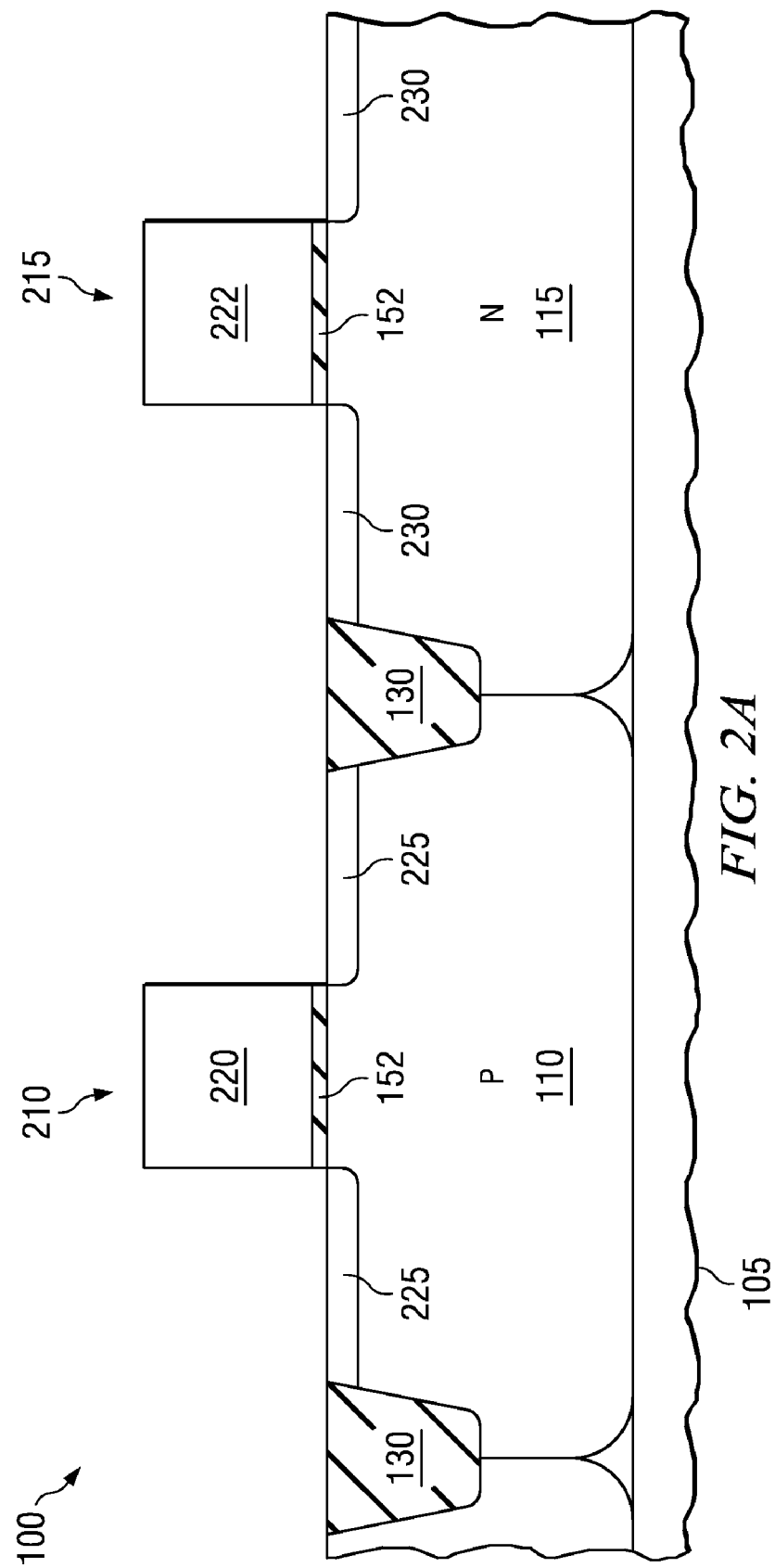
FIGS. 2A-2c illustrate the formation of sacrificial gate electrodes, source/drains, and sidewall spacers.

FIG. 2A illustrates a stage of manufacture of the device 100. In this embodiment, the device 100 includes the substrate 105, the wells 110, 115, the gate dielectric layers 152, and isolation structures 130, as previously discussed, all of which may be constructed using conventional processes and materials. In addition, however, the device 100 includes gate structures 210, 215. These gate structures include sacrificial gates 220, 222. As used herein, sacrificial gates are gates that are later removed and replaced with new gates, which may be referred to herein as a replacement gate (RG) process. Conventional processes may be used to form sacrificial gates 220, 222. For example, polysilicon may be deposited across the substrate 105 and then lithographically patterned to form the gates 220, 222. In one embodiment, gate 222 may be doped with a p-type dopant, such as boron with gate 220 remaining undoped.

Alternatively, both gates 220, 222, may remain undoped by the use of a hardmask. Following the formation of gates 220, 222, conventional processes and dopants may be used to implant dopants to form the extension regions 225, 230 adjacent the respective gates 220, 222. For example, if device 100 is intended to be a complementary device, extension regions 225 will be doped with an n-type dopant, while extension regions 230 will be doped with a p-type dopant; otherwise, the dopants may be the same. It should be understood that, in one embodiment, the extension regions 225, 230 may be activated during an activation anneal that occurs at a later stage of fabrication. The type of dopant and its concentration and depth of extension regions 225, 230 are device dependent.

Figure 2B:
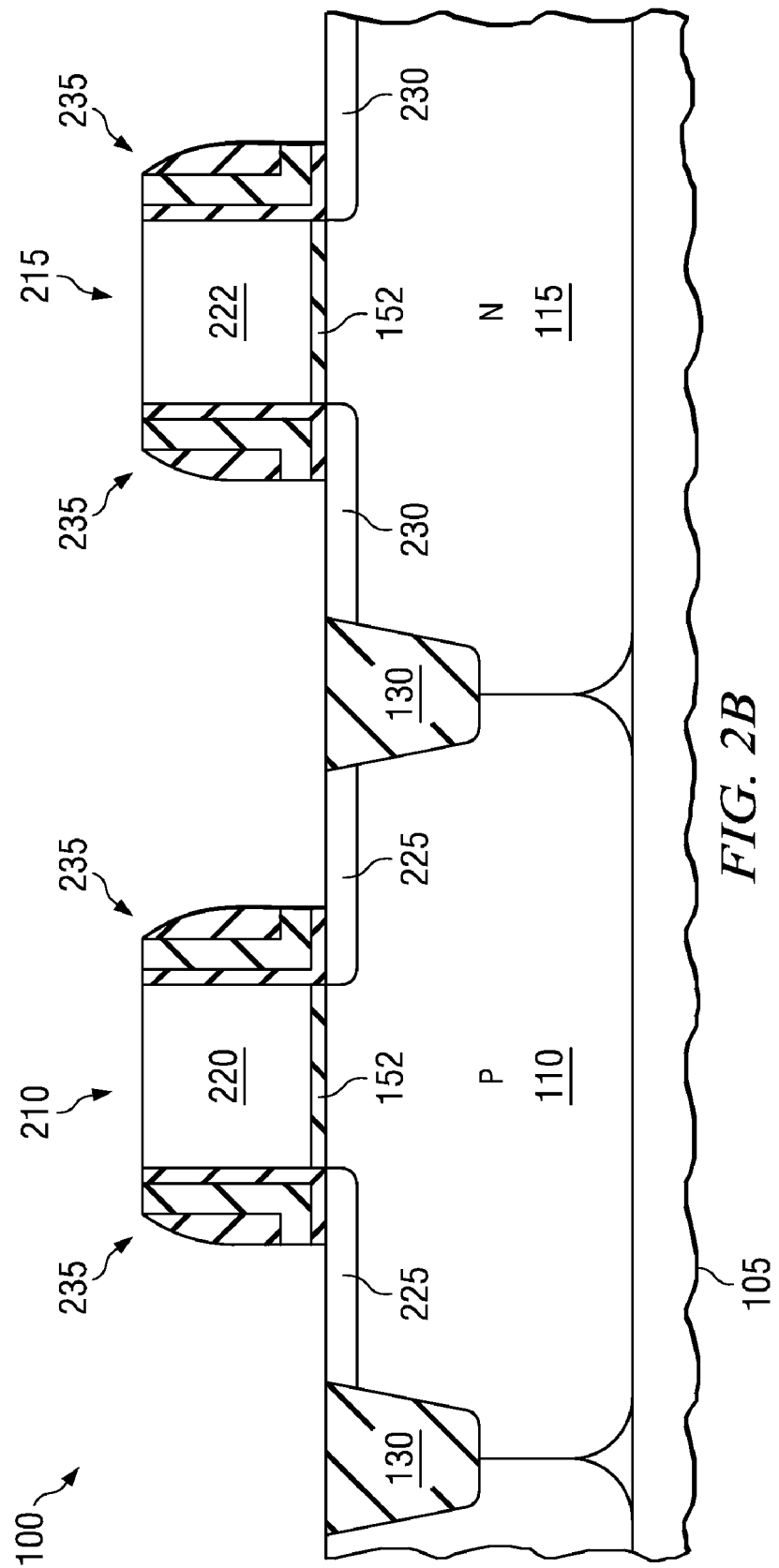

FIG. 2B illustrates the device 100 of FIG. 2A after the formation of sidewall spacers 235 adjacent the gates 220, 222. The sidewall spacers 235 may be fabricated using conventional deposition processes and materials and may comprise one or more layers of materials, such as oxide, silicon nitride, or combinations thereof. The etching processes used to form the sidewall spacers 235 cause them to have a width or thickness that extends from the gates 220, 222, as shown.

Figure 2C:
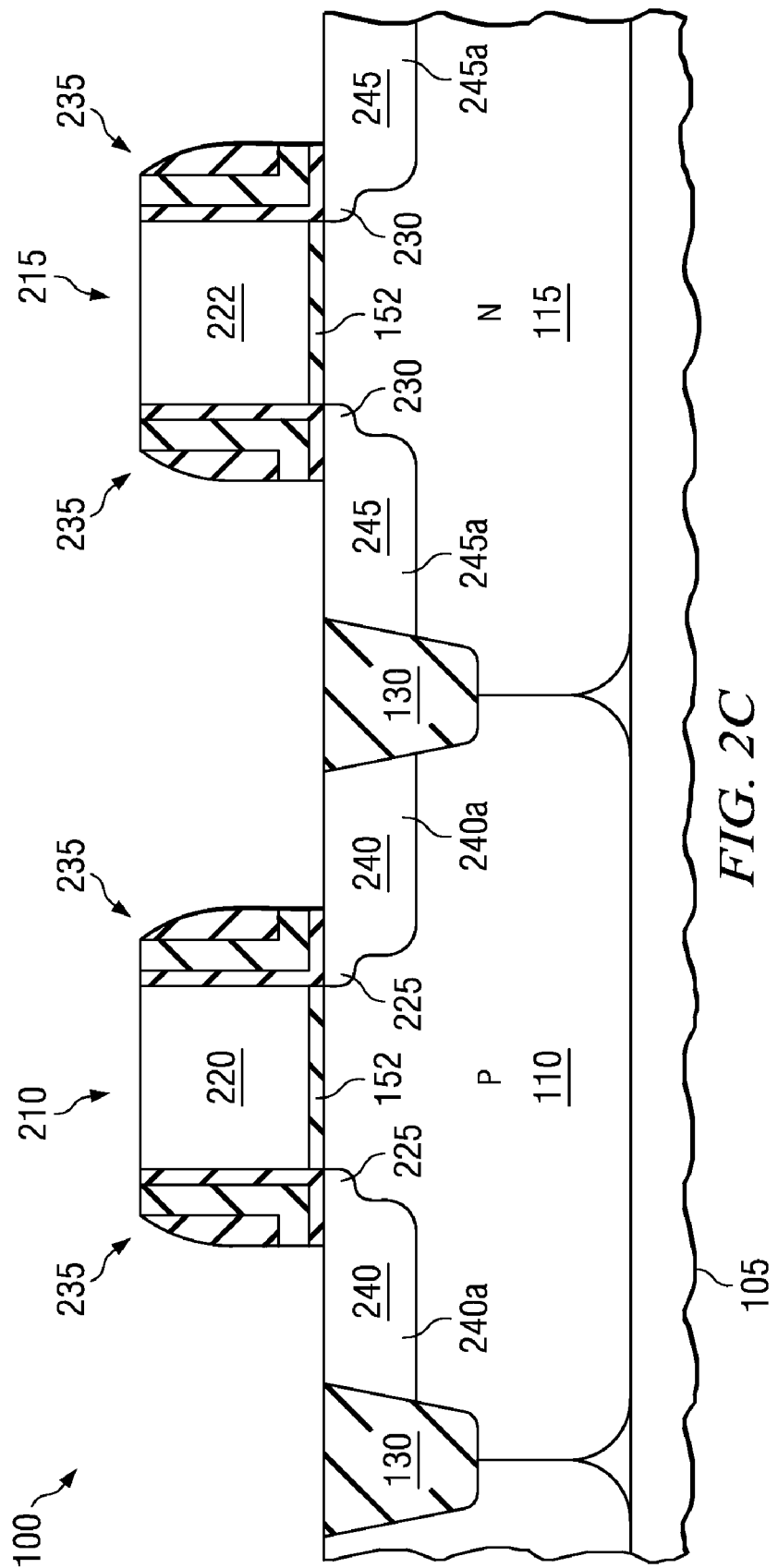

Following the formation of the sidewall spacers 235, conventional processes may be used to form source/drains 240, 245 (which includes extension regions 225, 230 and deep source/drains 240a, 245a), as shown in FIG. 2C. The source/drains 240, 245, in some embodiments, may be complementary doped with n-type and p-type dopants to form a CMOS configuration. In such instances, conventional process may be used to mask the appropriate region during implantation. Alternatively, the source/drains 240, 245 may be doped with the same dopant in a non-complementary configuration. In such embodiments, all of the source/drains 240, 245 can be doped simultaneously. The sidewall spacers 235 are used to offset deep source/drains 240a, 245a from the gates 220, 222 by the width of the sidewall spacers 235. The deep source/drains 240a, 245a are regions that have a higher dopant concentration and a deeper implant profile than the shallower extension regions 225, 230. The type of dopant, implantation depth, and concentration is device dependent and will vary. At this point, the source/drains 240, 245 may be activated by using a conventional activation anneal. The same activation anneal may be used to activate both the extension regions 225, 230 and deep source/drains 240a, 245a or separate anneals may be used. The sidewall spacers 235 are removed before or after the anneal is conducted. Since the sidewall spacers 235 are removed after the source/drains 240, 245 are formed and are not present in the completed device 100, they are sacrificial.

Conventional processes may be used to remove the sidewall spacers 235. For example, a hot phosphoric etch may be conducted to remove any nitride layers that comprise the sidewall spacers 235. In one embodiment, the temperature of the phosphoric etch may range from about 160° C. to about 180° C. and the phosphoric acid concentration of the etch may range from about 85 weight percent to about 95 weight percent. In addition, a hydrofluoric etch, such as a 1% hydrofluoric etch, may be used to remove any oxide layer that comprises the sidewall spacers 235. The time for conducting either of these etches may vary but should be monitored to insure that any over etch is minimized.

Figure 3A:
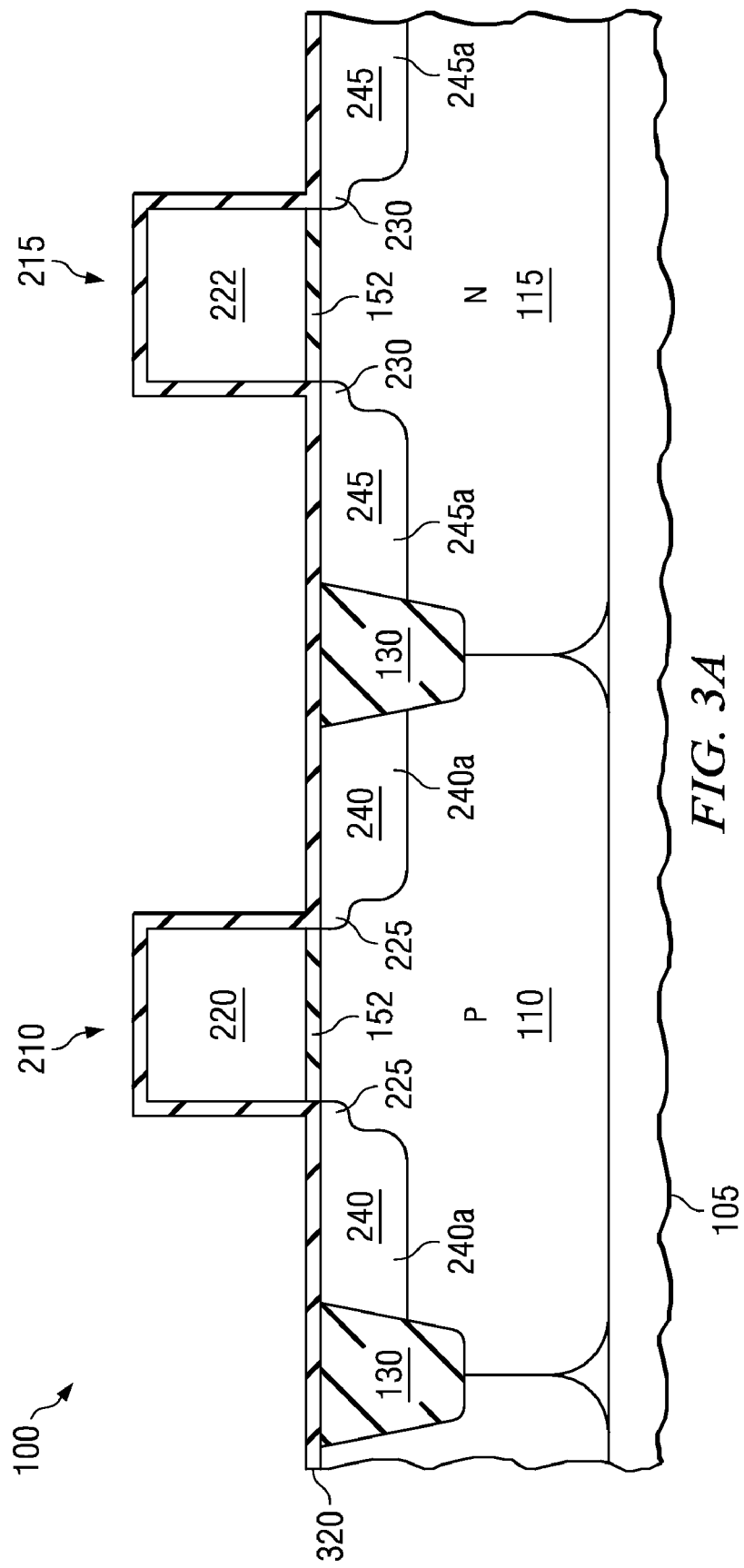
FIGS. 3A-3G illustrate the formation of a first metal gate electrode.

FIG. 3A illustrates the formation of a pre-metal dielectric layer 320 over the sacrificial gates 220, 222, after the sidewall spacers 235 have been removed. As seen, the layer 320 covers the sidewalls and tops of the sacrificial gates 220, 222. The layer 320 may be a single layer, as shown, or may comprise a stack of layers of the same, different, or a combination of dielectric materials. The thickness of the layer 320 may vary depending on design, but in one embodiment, the thickness of the layer 320 may be about 30 nm or less. The layer 320 may be a nitride layer (one that contains nitrogen), such as silicon nitride or silicon oxy-nitride, or combinations thereof. However, in other embodiments, the dielectric layer may be silicon oxide, silicon carbide, titanium nitride, or tantalum nitride.

The use of layer 320 in lieu of leaving the conventional sidewall spacers 235 in place, provides a benefit of reducing defects associated with conventional sidewall structures after metal deposition. Typically, in these processes, it has been learned that sidewall erosion occurs during the removal of the sacrificial gates, which causes recessed areas adjacent the gate area. This condition is exacerbated by subsequent chemical/mechanical polishing (CMP) processes. When metal is deposited into the gate cavity, it can lodge in these recesses, which can result in defects within the device. The benefit, in part, arises from the fact that since the sidewall spacers are removed before replacement gate formation, the problems associated with their presence are eliminated. This reduces defect issues and increases reliability. Moreover, the present process integrates well with RG processes.

Conventional processes may be used to deposit layer 320. For example, in those instances where layer 320 is silicon nitride, dicholorosilane and ammonia gases may be used to form layer 320. The gas flows and other deposition parameters can be adjusted to achieve the desired thickness. Deposition process, such as chemical vapor deposition, physical vapor deposition, or plasma deposition processes may be used to form layer 320.

Figure 3B:
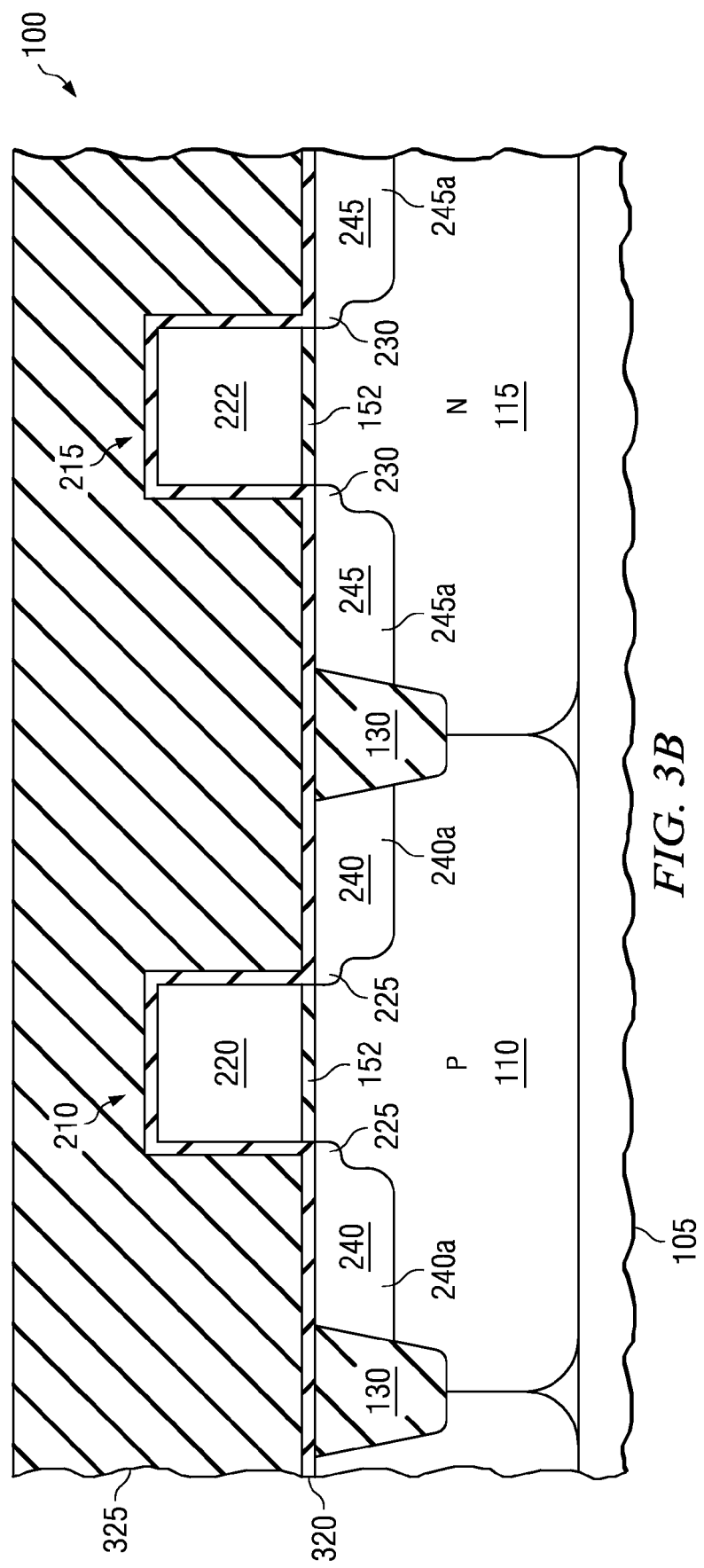

FIG. 3B illustrates the device 100 of FIG. 3A after the formation of another pre-metal dielectric layer 325. As seen, the layer 325 is located over layer 320 and extends over the sidewalls and tops of the sacrificial gates 220, 222. Layer 325 may be a single layer, as shown, or may comprise a stack of layers. The thickness of the layer 325 may vary and will depend on the desired work function. However, in one advantageous embodiment, the thickness of the layer 325 may be about 200 nm or less. In another embodiment, the thickness of layer 320 may range from about 10 nm to about 40 nm. In the illustrated embodiment, layer 325 comprises silicon oxide. However, in other embodiments, the layer 325 may be silicon nitride, silicon oxy-nitride, silicon carbide, or combinations thereof.

Conventional processes may be used to deposit layer 325. For example, in those instances where layer 325 is silicon oxide, tetraorthsilicate may be used to form layer 325. The gas flows and other deposition parameters can be adjusted to achieve the desired thickness. Deposition process, such as chemical vapor deposition, physical vapor deposition, or plasma deposition processes may be used to form layer 320.

Figure 3C:
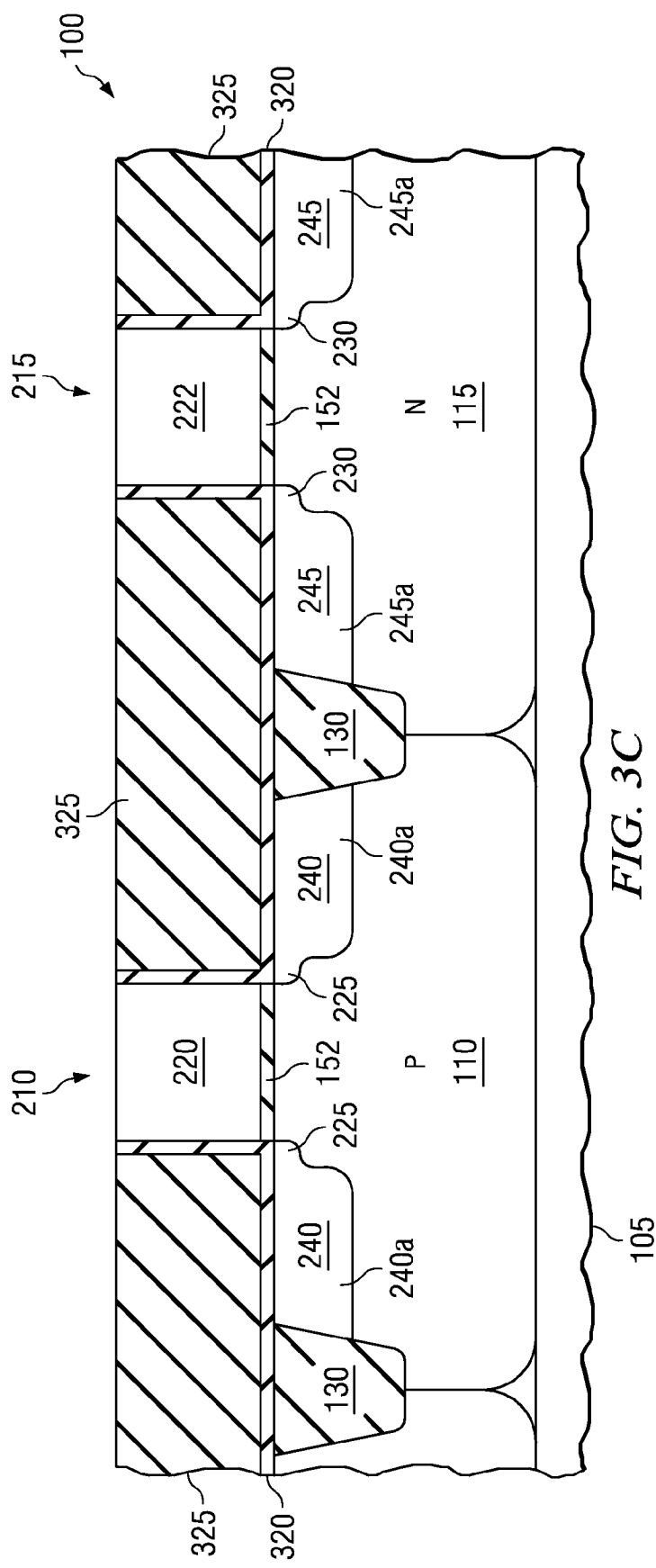

Following the deposition of dielectric layer 325, a conventional CMP, dry etch process, or a combination thereof may be conducted to expose the top portion of the gates 220, 222 as shown in FIG. 3C. The top portions of the gates 220, 222 are not related to orientation, but instead, refers to those portions of the gates 220, 222 that are exposed to subsequent removal processes.

Figure 3D:
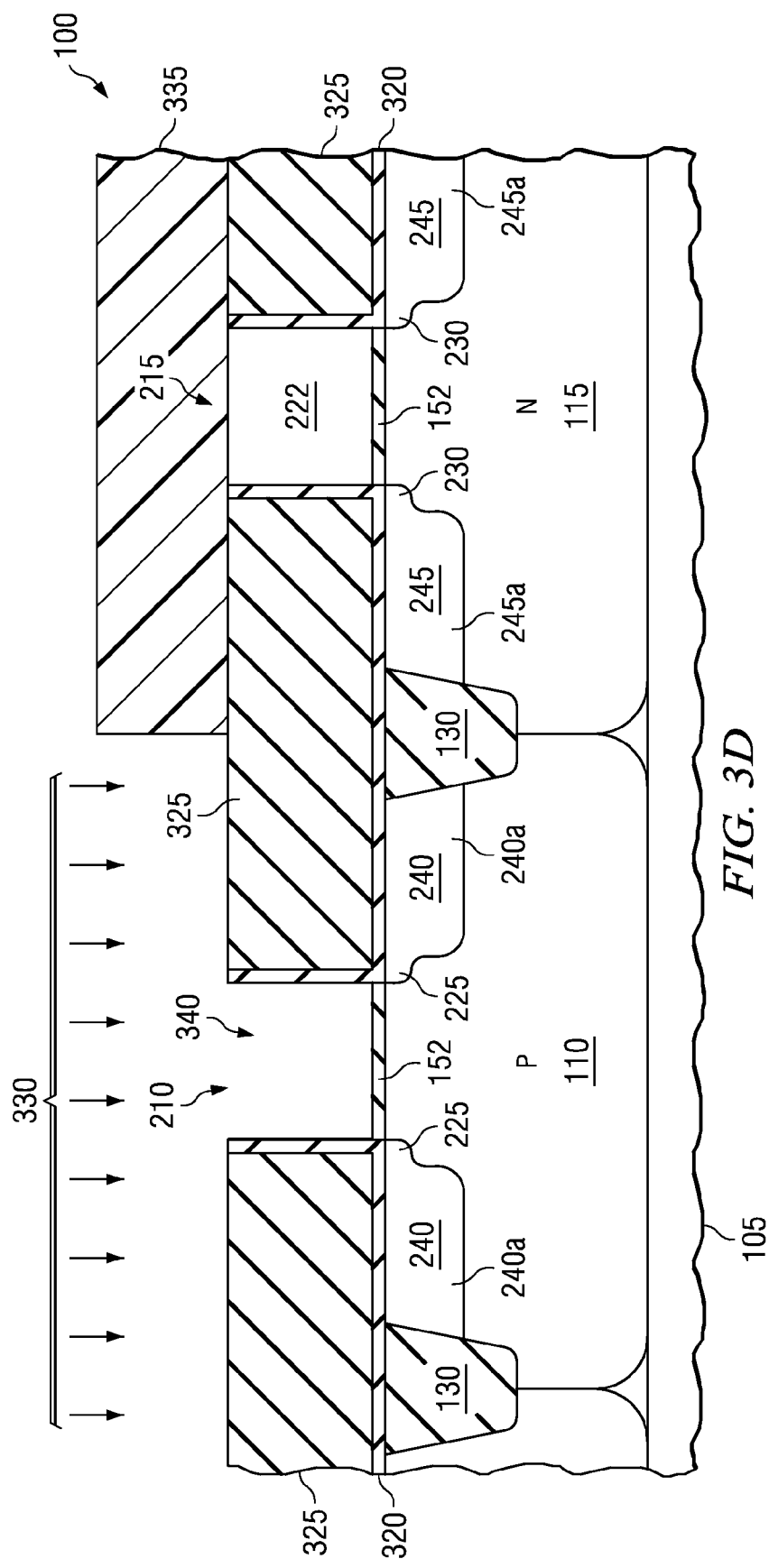

FIG. 3D shows the device of FIG. 3C following the removal of sacrificial gate 220. In this embodiment, a mask is deposited and patterned to expose sacrificial gate 220 to an etch process 330 that removes the gate 220. At this stage, an etch mask 335, such as a conventional photoresist, may be deposited and patterned to expose the gate structure 210, which in FIG. 3D may be an NMOS gate structure. With the gate structure 222 (PMOS gate structure) protected by the etch mask 335, the etch 330, which may be a conventional etch, may then be conducted to remove gate 220. The etch 330, however, does not remove the dielectric layer 320 located on opposite sidewalls of the gate 220, and thus layer 320 remains intact. This process forms a cavity 340 between the two portions of layer 320 in which a metal gate electrode can be subsequently formed.

The etch 330 that is used will depend on the type of material from which the sacrificial layer 220 is formed. For example, where the sacrificial layer 220 is polysilicon, the etch 330 may be ammonium hydroxide. Alternatively, in another embodiment where the sacrificial layer 220 is silicon dioxide or silicon nitride, the etch 330 may be hydrofluoric acid for oxide or phosphoric acid for nitride. As noted above, the etch 330, in one embodiment, removes the sacrificial layer 220 but leaves the other layers substantially intact, including the gate dielectric 152. However, in another embodiment, the etch 330 may be conducted in a way to also remove the gate dielectric. In such instances, conventional processes can be used to re-grow or re-deposit the gate dielectric. After the removal of the sacrificial layer 220, the etch mask 335 may be conventionally removed.

Figure 3E:
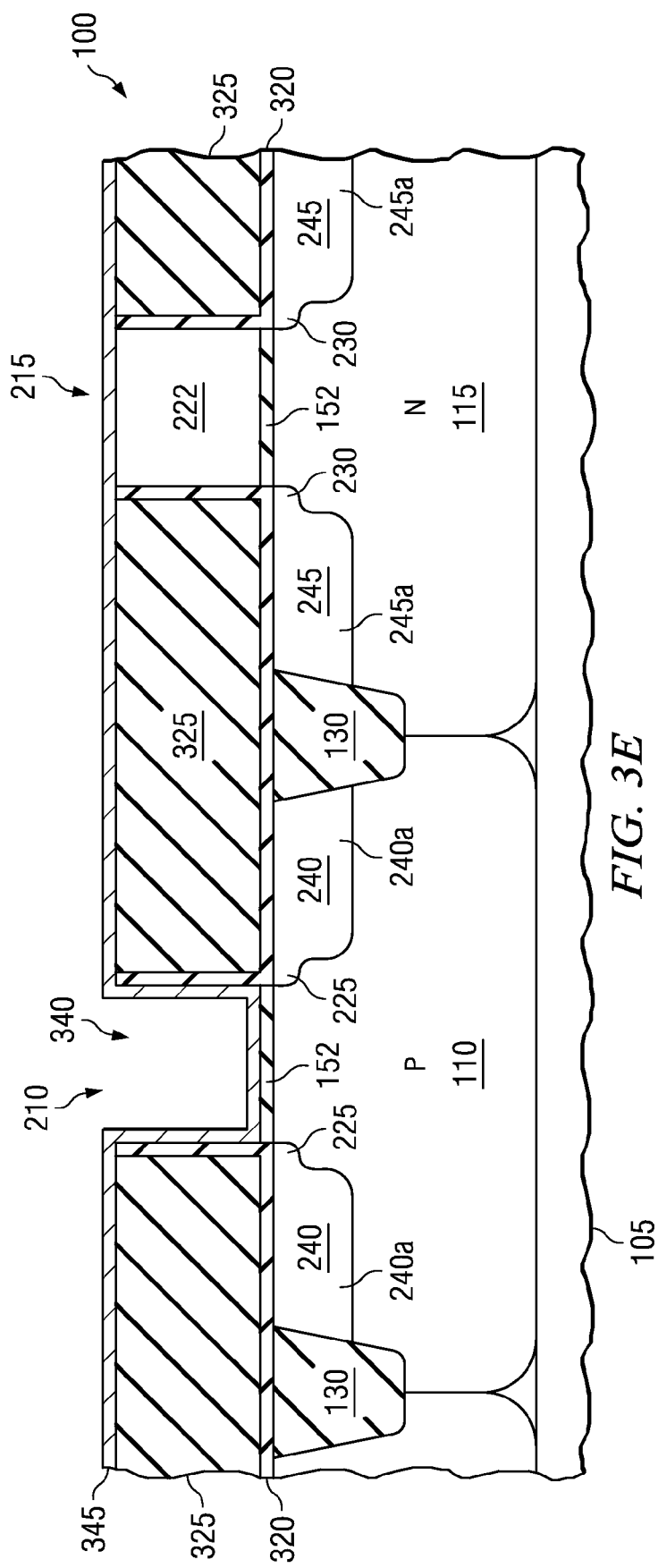

Following the removal of gate 220, a metal layer 345 is deposited over the substrate 105 and within the cavity 340, as seen in FIG. 3E. A metal layer is one that includes some percentage, which may vary, of metal or an alloy of that metal. Conventional deposition processes, such as chemical vapor deposition, physical vapor deposition, sputter deposition, atomic layer deposition, or plasma deposition processes may be used. Depending on the embodiment, the thickness of the metal layer 345 may range from about 15 nm to about 5 nm or less. Moreover, the type of metal used will depend on the work function of the device and whether the gate is an NMOS or PMOS electrode. For example, in the illustrated embodiment, the electrode is an NMOS gate electrode. As such, the metal layer 345 may include one or more, or alloys of an n-type metal. An n-type metal is a metal that has a work function suited for an NMOS device. Examples of such metals include vanadium, tantalum, niobium, titanium, zirconium, hafnium, scandium, yttrium, lanthanum, or ytterbium, including alloys and combinations of these metals. Combinations of these metals can be used to tune or adjust the work function for a particular operating voltage.

Figure 3F:
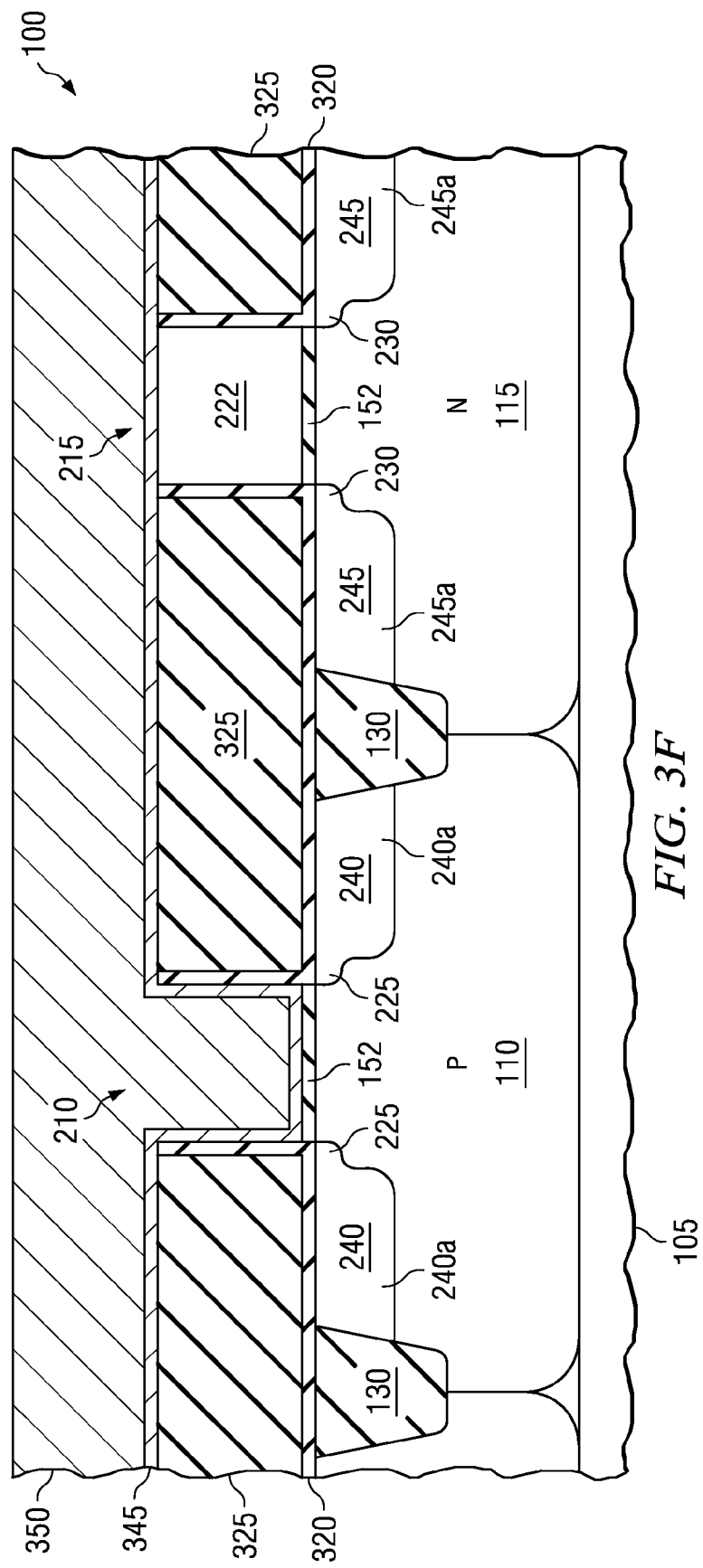

FIG. 3F illustrates the device 100 after the deposition of fill metal layer 350 over the metal layer 345. Conventional deposition process may be used to deposit this metal, as well. The deposition fills the cavity 340 (FIG. 3E) and also extends over the substrate 105. Types of metals that can be used at this point may include conventional metals, such as, copper, aluminum, tungsten, or combinations or alloys thereof.

Figure 3G:
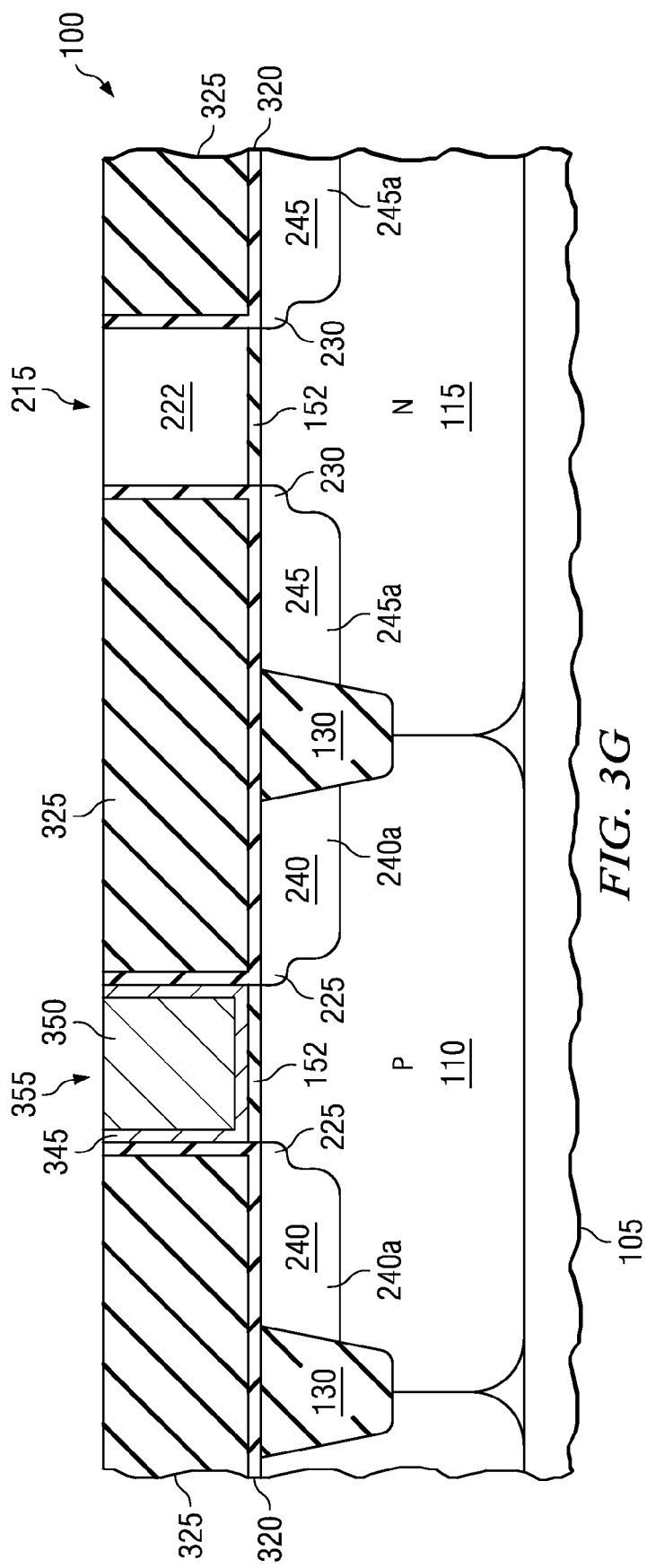

Upon the completion of the deposition of fill metal layer 350, conventional processes, such as CMP, may be used to remove bulk portions of metal layers 345 and 350, which complete the formation of the NMOS gate electrode 355, as shown in FIG. 3G. Since the sidewall spacers are not present during the formation of the gate electrode 355, the above-mentioned benefits can be recognized. Following this, another mask 405 is deposited and patterned to protect the gate electrode 355 from subsequent processes to arrive at the structures shown in FIG. 4A.

Figure 4A:
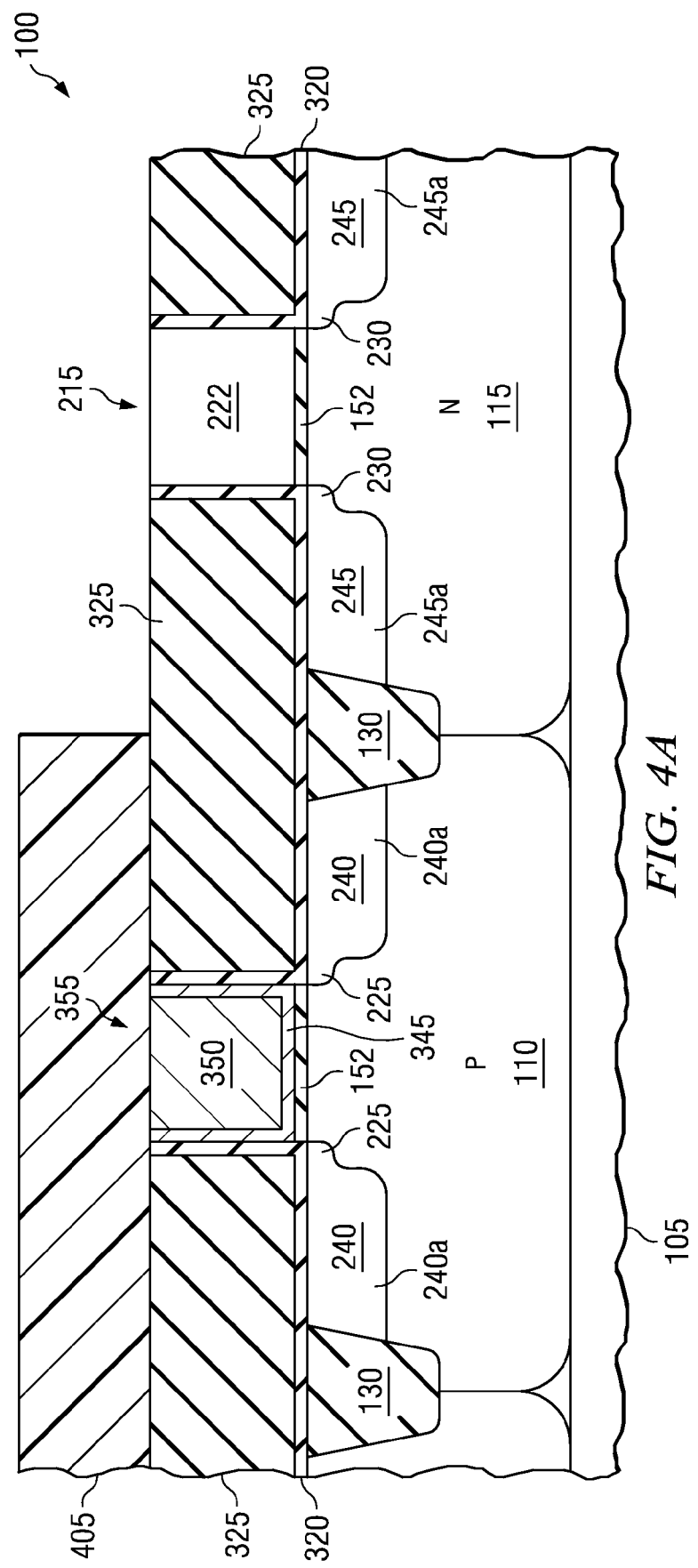
FIGS. 4A-4G illustrate the formation of a second metal gate electrode.
Figure 4B:
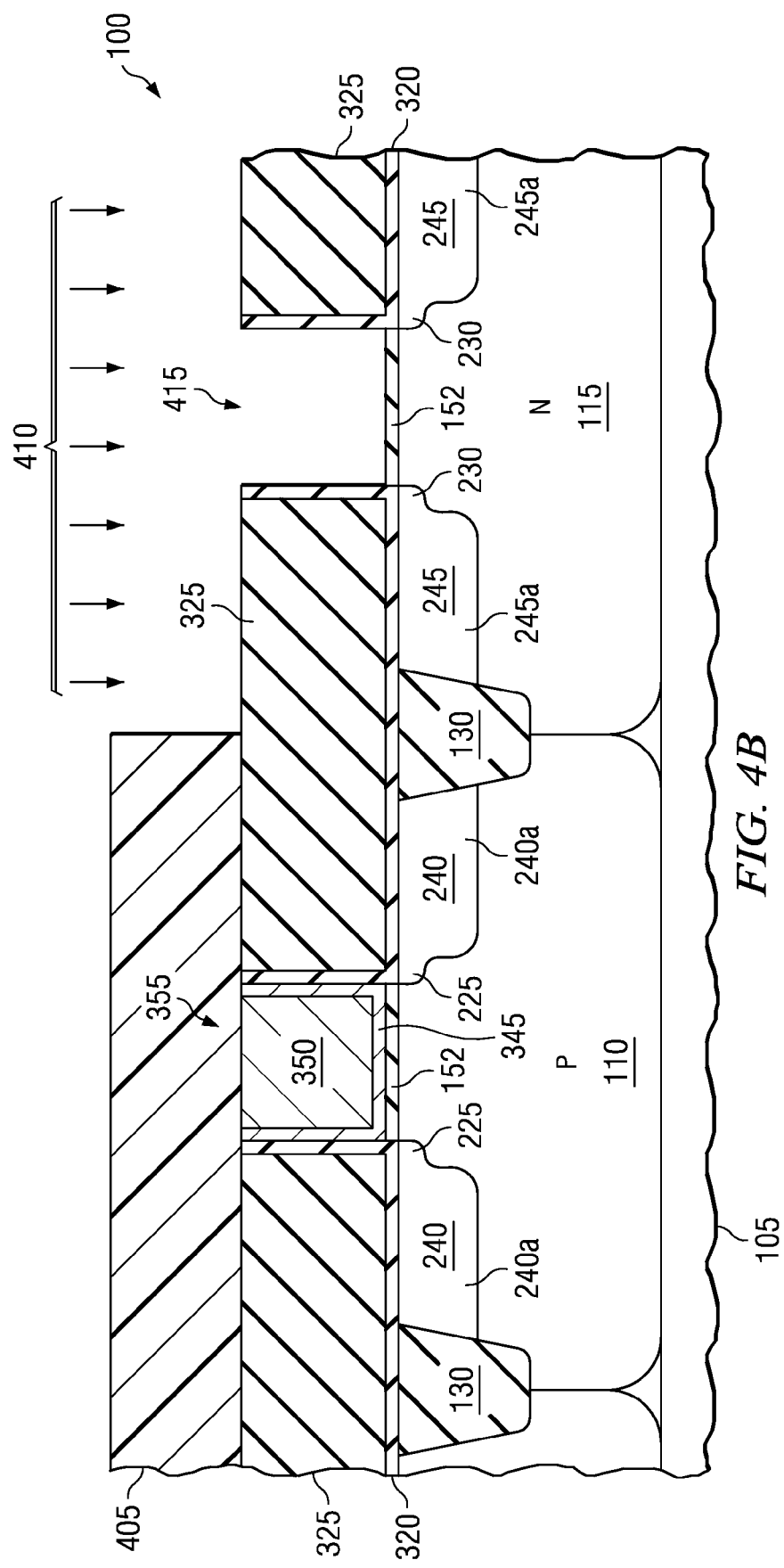

FIG. 4B shows the device of FIG. 4A following the removal of sacrificial gate 222. With the NMOS gate electrode 355 protected by the etch mask 405, the etch 410, a conventional etch, such as a plasma etch, may be used to remove gate 222 in those embodiments where gate 222 is doped with a p-type dopant. However, in those embodiments where gate 222 is not doped, the same etches used to remove gate 220 may be used to remove gate 222. The etch 410, however, does not remove the dielectric layer 320 located on opposite sidewall of the gate 222, and thus layer 320 remains intact. This process forms a cavity 415 in which a metal gate electrode can be subsequently formed.

The etch 410 will depend on the type of material from which the sacrificial layer 222 is formed. For example, where the sacrificial layer 222 is polysilicon, the etch 410 may be ammonium hydroxide. Alternatively, in another embodiment where the sacrificial layer 222 is silicon dioxide or silicon nitride, the etch 410 may be hydrofluoric acid for oxide or phosphoric acid for nitride. As noted above, the etch 410, in one embodiment, removes the sacrificial layer 222 but leaves the other layers substantially intact, including the gate dielectric 152. However, in another embodiment, the etch 410 may be conducted in a way that also removes the gate dielectric 152. In such instances, conventional process can be used to re-grow or re-deposit a new gate dielectric. After the removal of the sacrificial layer 222, the etch mask 405 may be conventionally removed.

Figure 4C:
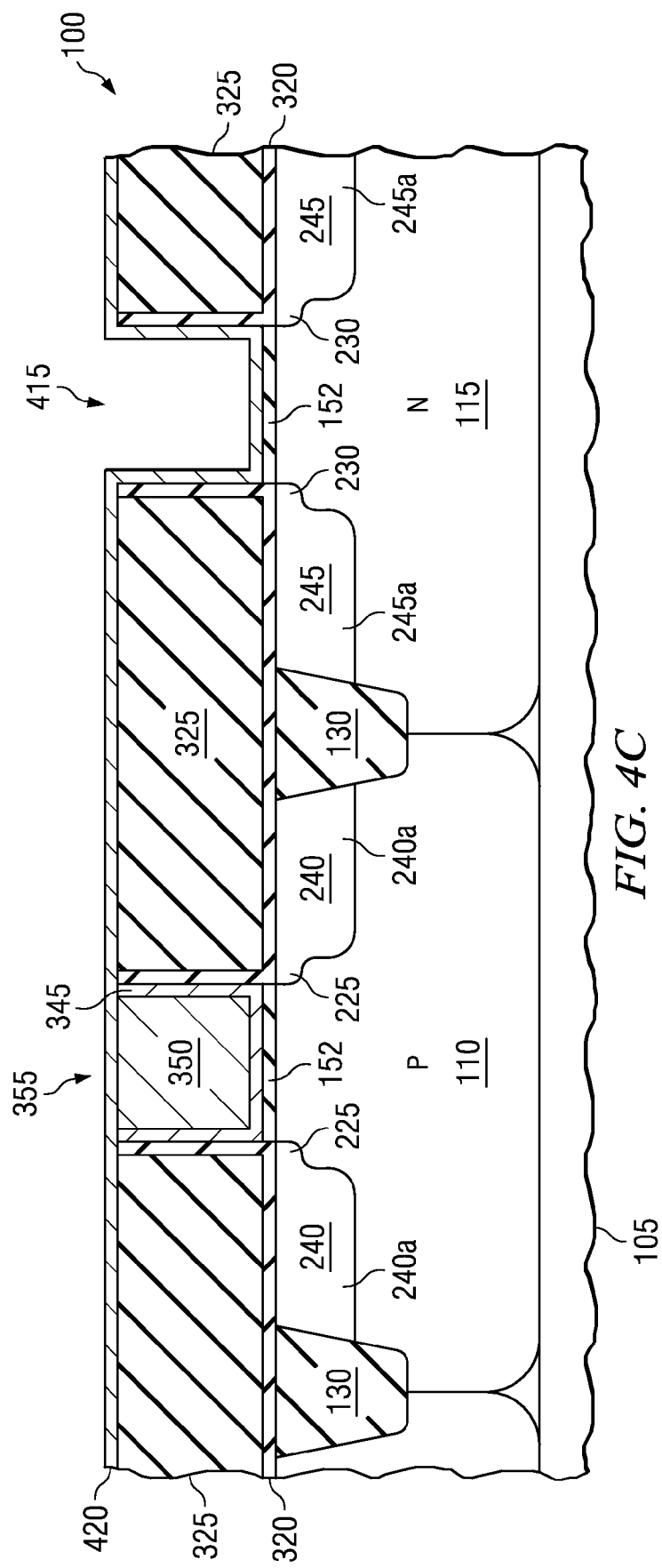

Following the removal of sacrificial gate 222, a metal layer 420 is deposited over the substrate 105 and within cavity 415, as illustrated in FIG. 4C. The metal layer 420 is one that includes some percentage, which may vary, of metal or an alloy of that metal. Conventional deposition processes, such as physical vapor deposition, sputter deposition, or plasma deposition processes may be used. Depending on the embodiment, the thickness of the metal layer 420 may range from about 15 nm to about 5 nm or less.

As was the case with the NMOS device 355, the selection of the metal layer 420 will depend on the desired work function. For example, if the gate electrode is to function as a PMOS device, the chosen metal may be platinum, iridium, nickel, cobalt, palladium, ruthenium, rhodium, or rhenium, or combinations or alloys thereof. These metals may be used in combination to adjust the work function for a particular operating voltage.

Figure 4D:
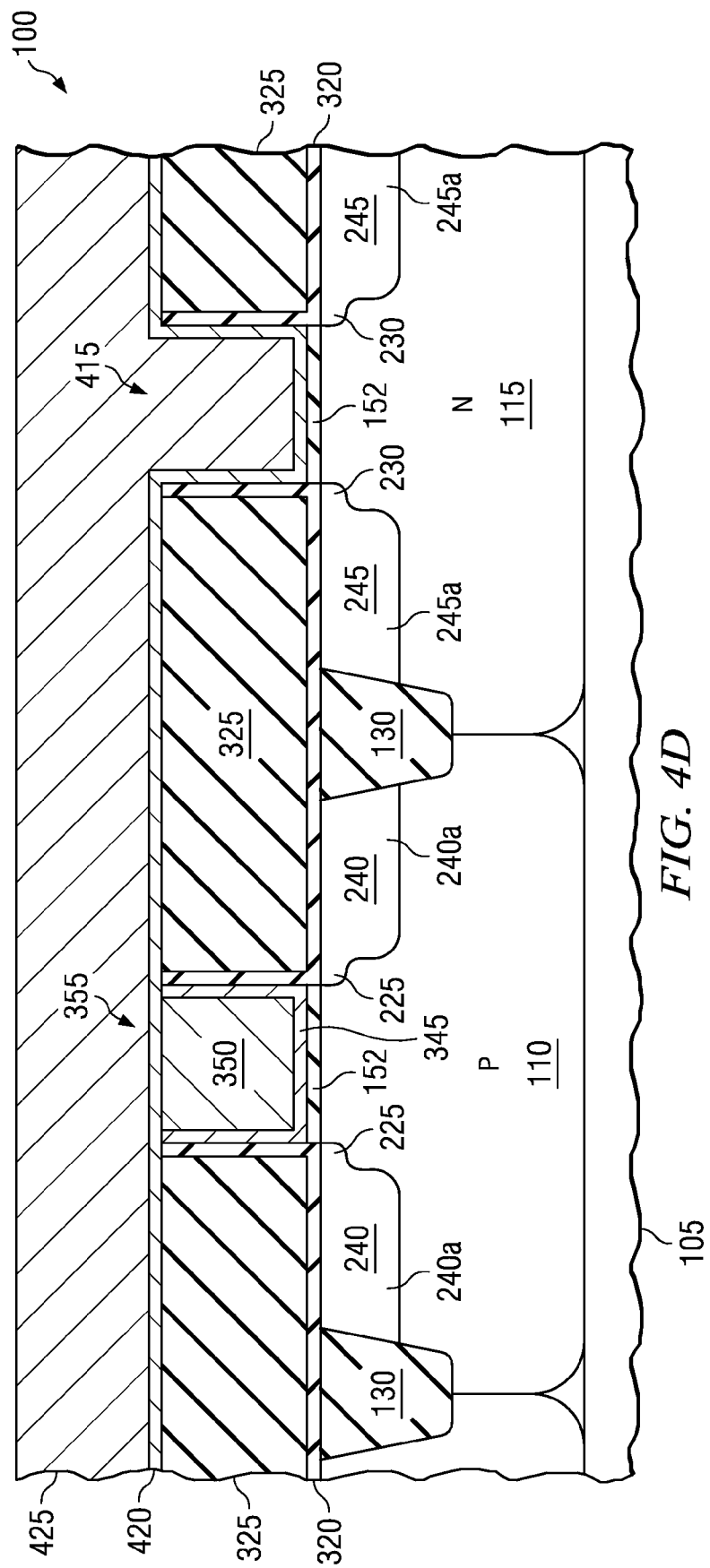

FIG. 4D illustrates the device 100 after the deposition of fill metal layer 425 over the metal layer 420. Conventional deposition process may be used to deposit this metal, as well. The deposition fills the cavity 415 (FIG. 4B) and also extends over the substrate 105. Types of metals that can be used at this point may include conventional metals such as, copper, aluminum, tungsten, or combinations or alloys thereof.

Figure 4E:
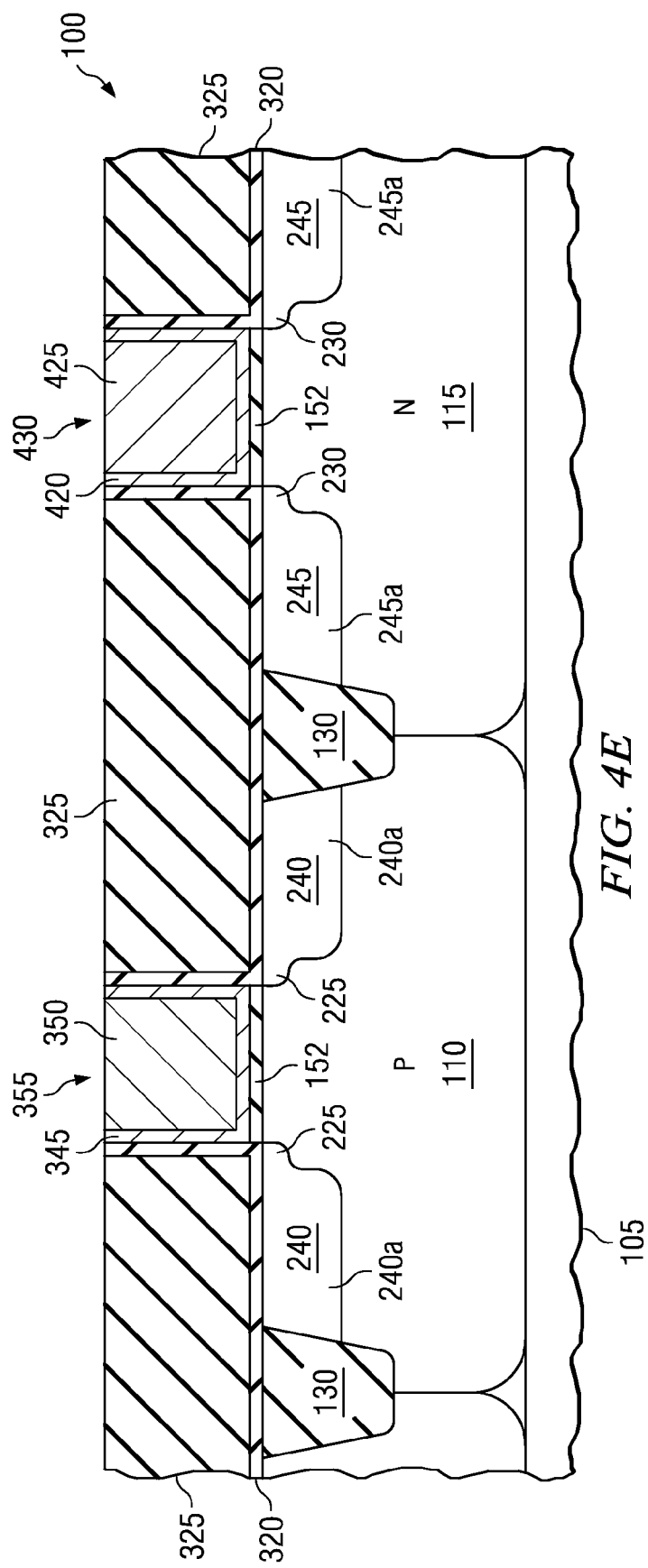

Upon the completion of the deposition of metal layer 425, conventional processes, such as CMP, may be used to remove bulk portions of metal layer 420 and 425, which completes the formation of a PMOS gate electrode 430, as shown in FIG. 4E.

It should be understood that though the formation of the NMOS gate electrode 355 was presented first, in other embodiments, the order may be changed and the PMOS gate electrode 430 may be formed before the NMOS gate electrode 355.

Figure 4F:
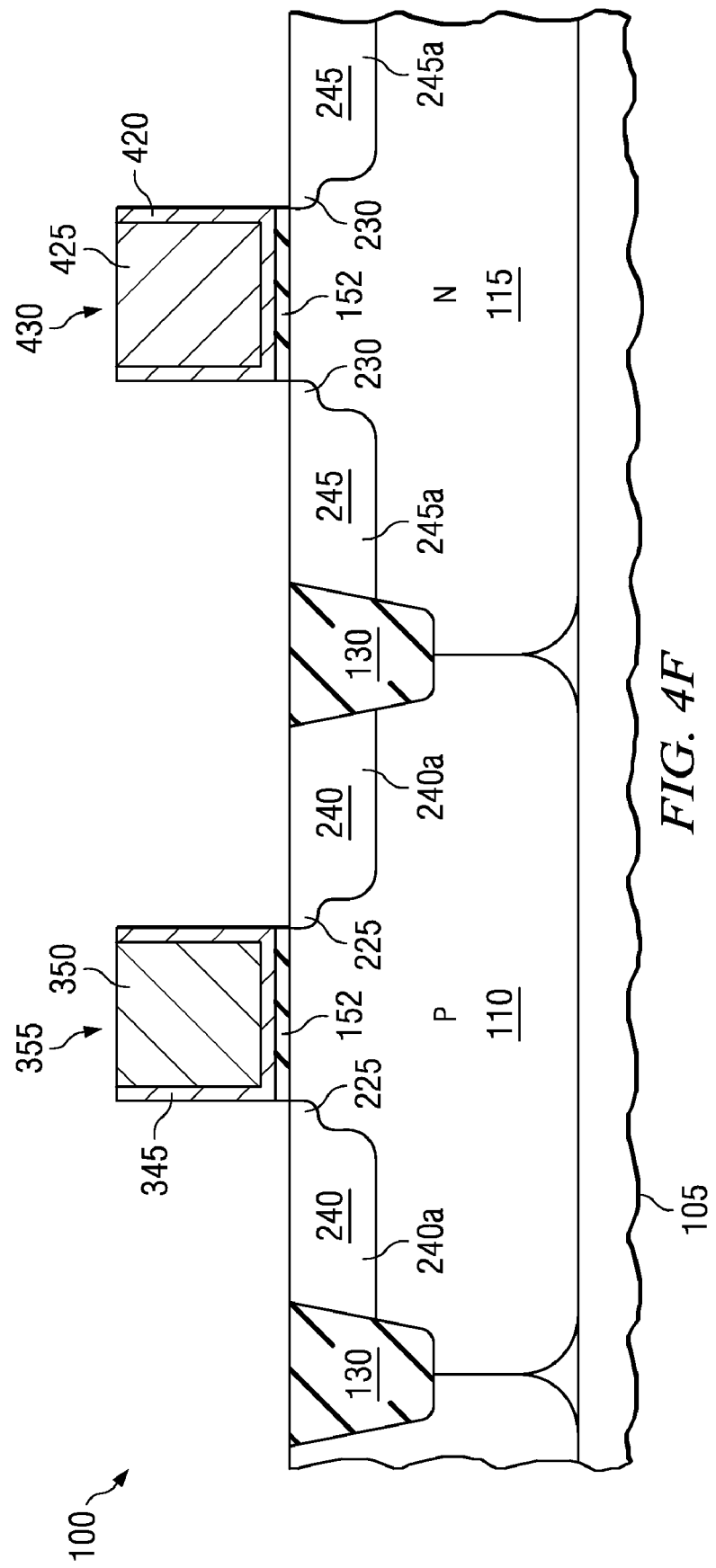
Figure 4G:
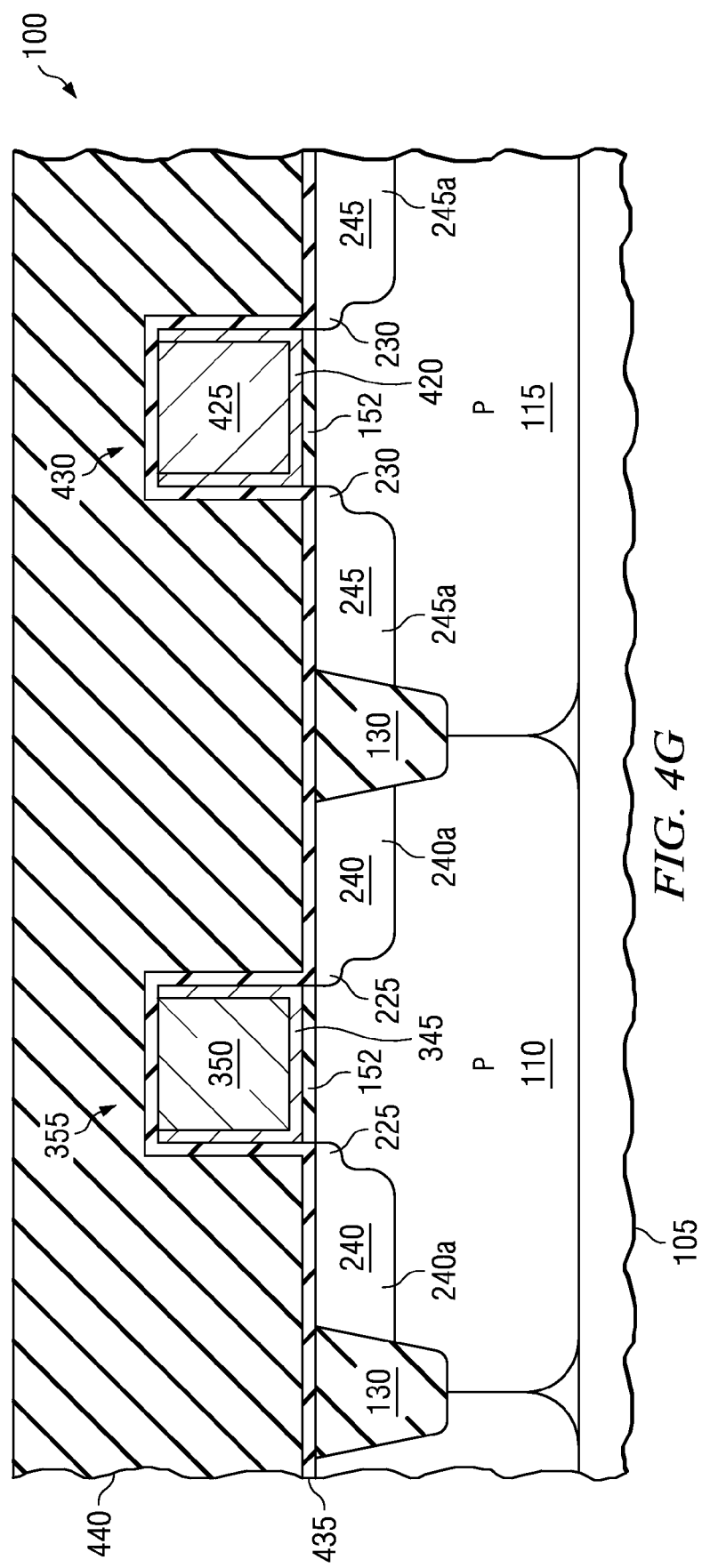

Following the formation of the gate electrodes 355 and 430, conventional processes may be used to remove the pre-metal dielectric layers 320, 325, as illustrated in FIG. 4F. Another pre-metal dielectric layer 435 may then be deposited over the gate electrode 355, 430, as shown in FIG. 4G. Conventional processes and materials may be used to form pre-metal dielectric layer 435. For example, in one embodiment, layer 435 may be comprised of silicon nitride as in previous embodiments and may have the same thickness as discussed above regarding layer 320. Another pre-metal dielectric layer 440 may be deposited over layer 435, also shown in FIG. 4G. Conventional depositional processes and materials may be used to form layer 440. For example, layer 440 may be comprised of dielectric materials, such as, silicon dioxide or silicon carbide.

At this point in the fabrication process, layer 435 serves as an etch stop for etch processes that are used to form the opening for contact plugs. Layer 435 can have an etch selectivity of as much as 40:1 when compared to layer 440. This selectivity allows for a soft landing on the gate electrodes 355, 430, while allowing for the etch to continue through the thickness of layer 440 to contact the source/drains 240, 245.

Figure 5:
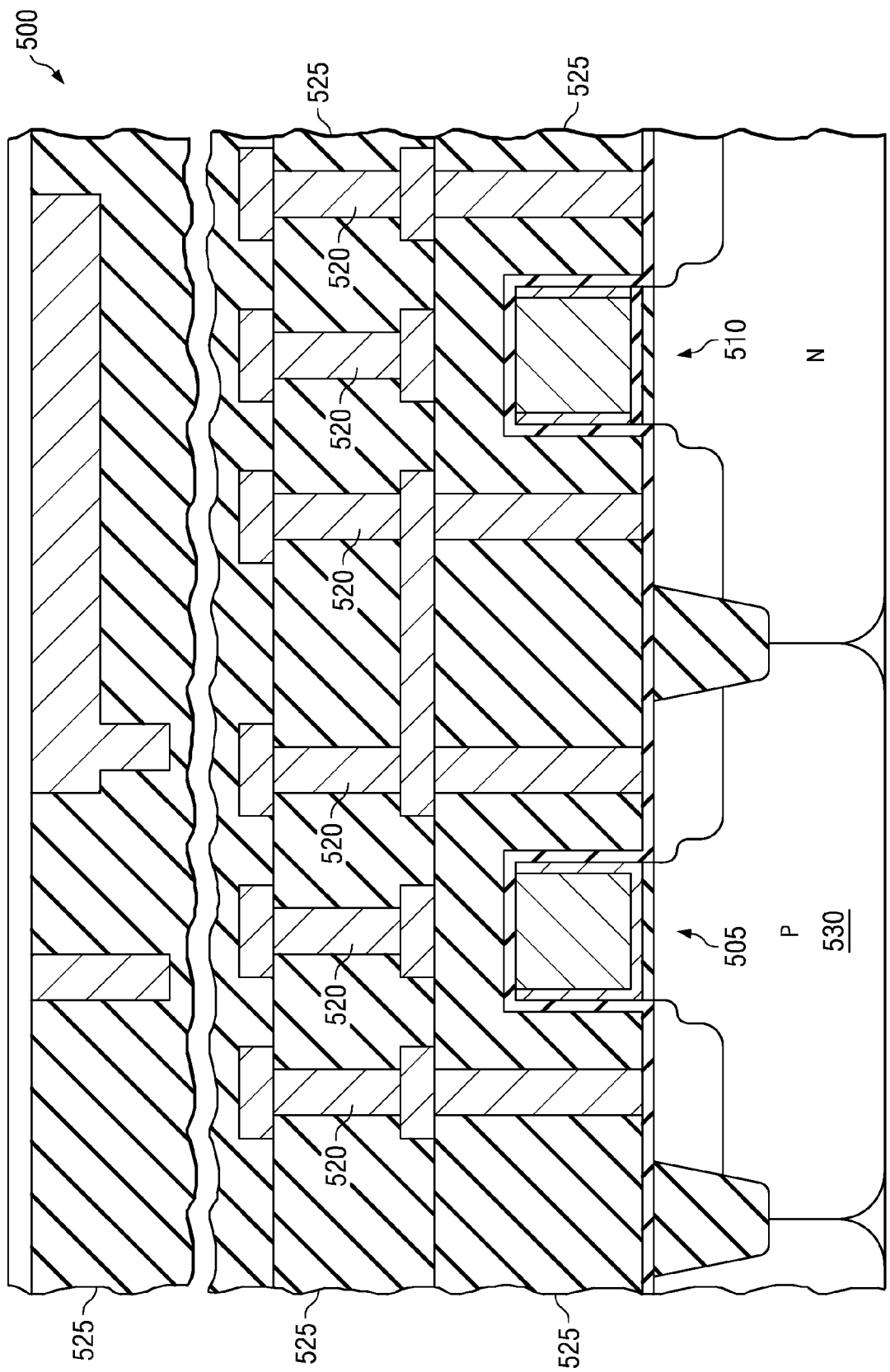
FIG. 5 illustrates an integrated circuit (IC) incorporating the semiconductor device of FIG. 1.

FIG. 5 illustrates an integrated circuit 500 into which the semiconductor device 100 of FIG. 4G may be incorporated. The IC 500, includes a dual work function metal gate transistors 505, 510. Each of the transistors 505,510 may comprise the components illustrated in FIG. 4G. Thus, the IC 100 may include complementary NMOS and PMOS devices. However, in other embodiments, the transistors 505, 510 may all be either NMOS or PMOS devices. The IC 100 also includes interconnects 520, which can include both metal runners or lines and vias, located on or within one or more insulating layers 525 that interconnect the transistors 505, 510. Conventional process may be used to construct these components.

The transistors 505, 510 and other device components can be formed according to any of the embodiments described herein. The work function of one of the transistors 505, 510 is matched to the conduction band of the substrate 530, while the work function of other transistor 510 is matched to valence band of the substrate 530. It should also be understood that the IC 100 will typically include a plurality of transistors 505, 510 and associated interconnects 520.

From the foregoing, it is evident that sidewall spacer removal prior to the formation of the metal gates allows the reduction of defects during RG processes by eliminating the recessed areas where metal can deposit unintentionally. Moreover, sidewall spacer removal is compatible with standard RG processes, and their removal can eliminate the recesses left by non-uniform or improper poly open etch. RG processes conducted after sidewall spacer removal will also increase manufacturability, yield, and reduce the capacitance between the contact and gate, allowing for improved performance.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:

forming a patterned sacrificial gate layer on a semiconductor substrate;

forming source/drain extension regions in the semiconductor substrate adjacent the patterned sacrificial gate layer;

forming sidewall spacers on sidewalls of the patterned sacrificial gate layer, the source/drain extension regions extending under the sidewall spacers;

forming deep source/drain regions in the semiconductor substrate adjacent the sidewall spacers;

performing at least one activation anneal to activate the source/drain extension regions and the deep source/drain regions;

after performing the at least one activation anneal, removing the sidewall spacers;

forming a nitride layer on sidewalls and on top of the patterned sacrificial gate layer subsequent to removing the sidewall spacers;

forming a dielectric layer over the nitride layer;

removing upper portions of the nitride layer and the dielectric layer to expose a top of the patterned sacrificial gate layer, wherein sidewall portions of the nitride layer remain on sidewalls of the patterned sacrificial gate layer;

after exposing the top of the patterned sacrificial gate layer, removing the patterned sacrificial gate layer to form a cavity between the sidewall remaining portions of the nitride layer; and forming at least one metal gate layer within the cavity.

2. The method of claim 1, further comprising forming a contact metal comprising tungsten, aluminum, copper, or a combination thereof, over the metal gate layer.

3. The method of claim 1, wherein the sidewall spacers comprise a nitride portion and an oxide portion; and removing the sidewall spacers includes using a phosphoric acid etch to remove the nitride portion and using a hydrofluoric etch to remove the oxide portion.

4. The method of claim 1, wherein the nitride layer is a first nitride layer and the dielectric layer is a first dielectric layer; and further comprising, after forming the at least one metal layer, removing a remainder of the first nitride layer and the first dielectric layer, and depositing a second nitride layer and second dielectric layer over the at least one metal gate layer.

5. The method of claim 1, wherein removing the patterned sacrificial gate layer to form the cavity includes using ammonium hydroxide.

6. The method of claim 1, further including forming source/drain contact plugs through the dielectric layer and the nitride layer.

7. A method of manufacturing a semiconductor device, comprising:
   forming NMOS and PMOS patterned sacrificial gate layers on a semiconductor substrate;
   forming sidewall spacers on sidewalls of the NMOS and PMOS patterned sacrificial gate layers;
   forming source/drain regions in the semiconductor substrate adjacent the sidewall spacers;
   performing at least one activation anneal to activate the source/drain regions;
   after performing the at least one activation anneal, removing the sidewall spacers;
   forming a first dielectric layer on sidewalls and on top of the NMOS and PMOS patterned sacrificial gate layers subsequent to removing the sidewall spacers;
   forming a second dielectric layer on the first dielectric layer;
   planarizing the first and second dielectric layers to expose tops of the NMOS and PMOS patterned sacrificial gate layers, wherein portions of the first dielectric layer remain on sidewalls of the NMOS and PMOS patterned sacrificial gate layers;
   after exposing the tops of the NMOS and PMOS patterned sacrificial gate layers, removing one of the NMOS and PMOS patterned sacrificial gate layers to form a cavity between the sidewall remaining portions of the first dielectric layer; and
   forming a metal gate layer within the cavity.

8. The method of claim 7, further comprising, prior to forming the sidewall spacers, forming source/drain extension regions in the semiconductor substrate adjacent the NMOS and PMOS patterned sacrificial gate layers; and wherein the at least one activation anneal also activates the source/drain extension regions.

9. The method of claim 7, wherein the sidewall spacers comprise an oxide portion and a nitride portion; and removing the sidewall spacers includes using a phosphoric acid etch to remove the nitride portion and using a hydrofluoric etch to remove the oxide portion.

10. The method of claim 7, wherein the first dielectric layer comprises a nitride and the second dielectric layer comprises an oxide.

11. The method of claim 7, wherein removing the one of the NMOS and PMOS patterned sacrificial gate layers includes using ammonium hydroxide.

12. The method of claim 7, further comprising forming source/drain contact plugs through the first and second dielectric layers.

13. The method of claim 7, wherein the cavity is a first cavity and the metal gate layer is a first metal gate layer; further comprising, after exposing the tops of the NMOS and PMOS patterned sacrificial gate layers, removing the other of the NMOS and PMOS patterned sacrificial gate layers to form a second cavity between the sidewall remaining portions of the first dielectric layer; and forming a second metal gate layer within the second cavity.

14. The method of claim 13, further comprising forming a contact metal over the first and second metal gate layers.

15. The method of claim 13, further comprising, after forming the first and second metal gate layers, removing a remainder of the first and second dielectric layers; and forming third and fourth dielectric layers over the first and second metal gate layers.

16. A method of manufacturing a semiconductor device, comprising:
   forming a patterned sacrificial gate layer on a semiconductor substrate;
   forming sidewall spacers on the patterned sacrificial gate layer;
   forming deep source/drain regions in the semiconductor substrate adjacent the sidewall spacers;
   performing an activation anneal to activate the source/drain regions;
   after performing the activation anneal, removing the sidewall spacers;
   forming a conformal first pre-metal dielectric layer over the patterned sacrificial gate layer after removing the sidewall spacers;
   forming a blanket second pre-metal dielectric layer over the first pre-metal dielectric layer;
   using chemical-mechanical polishing, planarizing the first and second pre-metal dielectric layers to expose a top of the patterned sacrificial gate layer, wherein sidewall portions of the first pre-metal dielectric layer remain on sidewalls of the patterned sacrificial gate layer;
   after exposing the top of the patterned sacrificial gate layer, removing the patterned sacrificial gate layer to form a cavity between the sidewall remaining portions of the first pre-metal dielectric layer; and
   forming a metal gate layer within the cavity.

17. The method of claim 16, wherein the first pre-metal dielectric layer is a nitride layer and the second pre-metal dielectric layer is an oxide layer.

18. The method of claim 17, wherein the metal gate layer is a first metal gate layer; and further comprising forming a second metal gate layer within the cavity over the first metal gate layer.

* * * * *